United States Patent [19]
Yuan et al.

[11] Patent Number: 5,097,227
[45] Date of Patent: Mar. 17, 1992

[54] MICROWAVE OSCILLATOR POSITION SENSOR

[75] Inventors: Han-Tzong Yuan; Hua Q. Tserng; Hung Y. Yee, all of Dallas, Tex.

[73] Assignee: Texas Instruments Incorporated, Dallas, Tex.

[21] Appl. No.: 594,504

[22] Filed: Oct. 9, 1990

[51] Int. Cl.$^5$ .......................... G01V 3/08; H03B 5/18
[52] U.S. Cl. ...................................... 331/65; 324/327; 331/107 SL; 331/117 D; 340/671; 340/686
[58] Field of Search .................. 331/65, 96, 107 DP, 331/107 SL, 117 D; 324/327; 340/669, 670, 671, 672, 686

[56] References Cited

U.S. PATENT DOCUMENTS 4,173,755 11/1979 Butler ............................. 331/65 X
4,475,089 10/1984 Kahuke ............................. 331/65

*Primary Examiner*—Siegfried H. Grimm
*Attorney, Agent, or Firm*—Richard A. Stoltz; Richard A. Donaldson; Rene E. Grossman

[57] ABSTRACT

A microwave oscillator circuit having an antenna, wherein the effective reactive impedance of the oscillator circuit is altered by the movement of a reactive impedance changing element past the antenna to cause change of the oscillation condition of the oscillator. A change in oscillation condition is sensed and sent to a utilization device to determine speed and/or position. The utilization device can be a computer which receives a signal from a wheel speed determining system, wherefrom a signal is sent back to a braking system for the wheel to control braking thereof. This can be accomplished individually for each of the four wheels to provide an anti-locking braking system.

12 Claims, 1 Drawing Sheet

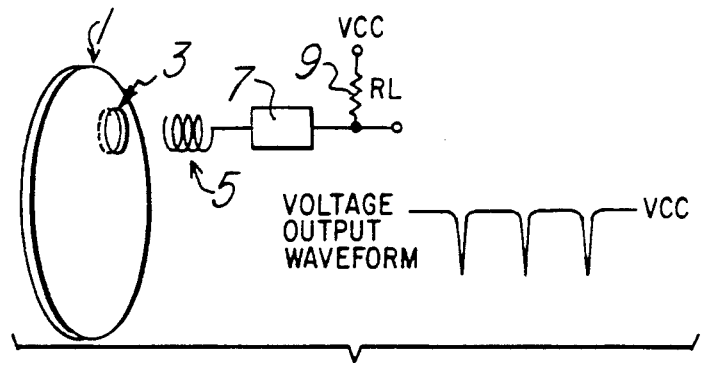
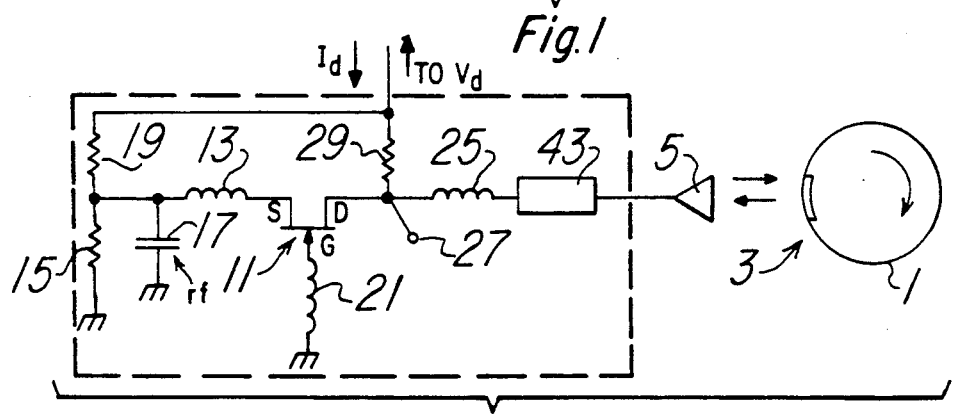
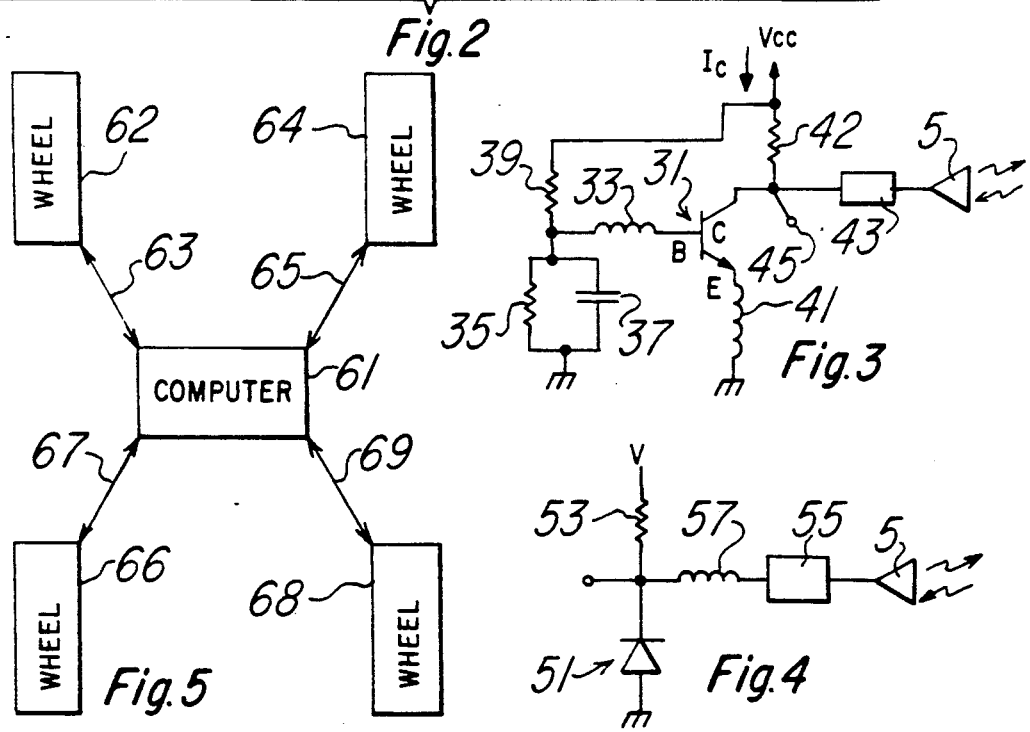

MICROWAVE OSCILLATOR POSITION SENSOR

CROSS REFERENCE TO PRIOR APPLICATIONS

This application is related to Ser. No. 07/594,505, filed Oct. 9, 1990, the contents of which are incorporated herein by reference.

BACKGROUND OF THE INVENTION

1. Field of the Invention

This invention relates to a position sensor and, more specifically, to a microwave position sensor using a solid state transistor or diode oscillator and antenna coupling.

2. Brief Description of the Prior Art

In general, there are presently three types of position sensors available. The most commonly used type, for example, in anti-skid brake systems includes a pickup coil which transmits a current pulse when a magnet passes across the coil. This design is rugged and low cost, however it has a useful output only when the wheel turns at a predetermined minimum angular velocity. The second type of position sensor, which uses the magnetoresistance principle, can detect zero angular velocity, however the output critically depends upon the spacing between a sensor and a magnet. Normally, such a constant space on the order of 100 mils can not be maintained easily in a rotating wheel. The third type of position sensor, which uses the Hall effect, has the advantage that a preamplifier can be designed and merged with the Hall sensor. Thus, the output can be made considerably larger than the magnetoresistance sensor. However, the Hall sensor also suffers from spacing requirement. Furthermore, it is more sensitive to temperature, thereby making it less valuable for use in conjunction with automobile electronics. It is therefore apparent that a position sensor which can overcome the above noted deficiencies of the prior art is sought and would be useful, particularly in the anti-lock braking systems (ABS) which are presently replacing the prior art automotive braking systems.

SUMMARY OF THE INVENTION

In accordance with the present invention, there is provided a low cost microwave oscillator to detect position, primarily wheel position, which has the advantage of constant output, regardless of wheel angular velocity and which is capable of tolerating large spacing between the sensor and the wheel.

Briefly, in accordance with the present invention, there is provided a transistor-type microwave oscillator and a pseudoantenna, which can be a printed circuit, which is reactively coupled to the position index one wishes to sense, the antenna being a part of the reactive impedance of the oscillator circuit. In the case of speed sensing for an automobile, for example, a wheel plate having a discontinuity therein is placed within one wavelength of the antenna, the antenna thereby being tightly coupled to the wheel through an image field. The wheel plate can be a plastic plate with a metal piece therein, a metal plate with a hole therein, a toothed metal wheel or the like, the presence or absence of the metal piece or hole in the disk or field plate causing an abrupt change of the reactive impedance of the antenna. If the oscillator is initially known to be one of normally oscillating or non-oscillating, and the change in the magnitude and/or phase angle of the reactive impedance is sufficiently large, the impedance change will cause turn off or turn on the oscillator which includes the antenna, the oscillator being designed to do so under the conditions when the aperture is or is not reactively coupled thereto. If the oscillator is biased in class B mode, the on condition of the oscillator will draw more current than the off condition. This conditions creates a voltage dip at the end of a load resistor coupled to the oscillator which is used to feed the oscillator. Since the voltage dip is created by a hole in the wheel plate, the measure of the period of voltage dip at the output, which is the output terminal of the oscillator and the load resistor, is a measure of the rotational speed of the wheel.

For small size and high spatial resolution, the highest possible microwave frequency that can be used for the oscillator is utilized. For example, at 10 GHz, the helical antenna can be as small as 1 cm. With GaAs devices, preferably MESFET or HBT, such a microwave oscillator is constructed with only one transistor.

A helical antenna is used because it has the advantage of good spatial resolution, tight coupling and is ideal for chopper type applications, such as wheel speed sensors. If the microwave position sensor is to be used to measure linear position or distance rather than rotary position or distance, then more loosely coupled antennas, such as capacitive plate or dipole antennas, would be more advantageous.

The sensor in accordance with the present invention provides the advantages over the prior art of constant magnitude output which can detect zero velocity as well as high speed, can tolerate large spacing (1 wavelength) between the antenna and sensing index, is low cost with the need of only one transistor to construct the microwave oscillator and provides a simple read out which is compatible with either one wire or two wire sensor systems.

In accordance with a first embodiment of the invention, a microwave transistor (i.e. FET, silicon bipolar, AlGaAs/GaAs heterojunction bipolar) is made to oscillate at microwave frequencies when appropriate feedback circuits are used. The most common feedback circuit for an FET is inductive feedback from gate to ground. With an appropriate matching circuit on the drain, microwave power is coupled to the load. For oscillation to occur, the load impedance must have the optimum magnitude and phase angle. If the transistor is biased near class B (near pinch-off), there will be considerable drain current modulation when the device output power is changed by changing the load impedance. If the oscillator output is connected to an antenna which is then interfered with by a variable spacing from an object such as a groundplane, the oscillator is modulated with resulting change in current. When this current is flowing through a resistor or a current mirror (not in the embodiment shown), the resulting voltage change is used as a position indicator.

In accordance with a second embodiment of the invention, the first embodiment is repeated except that the FET oscillator circuit is replaced by a bipolar/HBT oscillator circuit. In this case all circuitry is identical except that the connections to the source, drain and gate of the first embodiment are replaced by base, collector and emitter respectively. The circuit parameter values will also be changed as necessary to accommodate the bipolar transistor operation.

In accordance with a third embodiment of the invention, an IMPATT diode oscillator circuit is utilized. The oscillation or non-oscillation state of the diode oscillatr will also cause the load current change which, in turn, will result in a voltage change across the load resistor.

The above described embodiments can be use to determine position and rotational speed. In addition, since the reactive impedance of the oscillator circuit is determined by the spacing between wheel and antenna, changes in reactive impedance due to changes in wheel distance from the antenna during a single rotation can be used to determine wheel alignment.

BRIEF DESCRIPTION OF THE DRAWINGS

FIG. 1 is a schematic drawing of a typical position sensing system for a wheel in accordance with the present invention;

FIG. 2 is a circuit diagram in accordance with a first embodiment of the present invention;

FIG. 3 is a circuit diagram in accordance with a second embodiment of the present invention;

FIG. 4 is a circuit diagram in accordance with a third embodiment of the present invention; and FIG. 5 is a block diagram of a control system in accordance with the present invention.

DESCRIPTION OF THE PREFERRED EMBODIMENTS

Referring first to FIG. 1, there is shown a schematic drawing of a typical position sensing system for a wheel in accordance with the present invention. The wheel 1, made of an electrically conductive metal, preferably copper, has a hole 3 therein or alternatively is made of a non-electrically conductive material, preferably plastic and has an electrically conductive material where the hole 3 is shown. The wheel is spaced less than one wavelength of the oscillating frequency of the oscillator circuit 7 from an antenna 5 which is coupled to and is a part of the oscillator circuit. The oscillator is coupled to a source of voltage ($V_{cc}$) via a load resistor 9. The output from the oscillator circuit is taken from the output terminal of the oscillator 7 and the load resistor 9.

The oscillator 7 is initially designed to either normally oscillate or not oscillate. This circuit 7 is also designed so that when the hole 3 in the wheel passes the antenna 5, there is an abrupt change in the reactive impedance of the antenna. If the magnitude or phase angle of the impedance change is sufficiently large, it will cause the oscillator 7 to alter its mode of operation from oscillating to non-oscillating or vice versa. The output is sent to a utilization device which uses the information in a suitable manner as will be described in more detail hereinbelow.

Referring now to FIG. 2, there is shown a first embodiment of a position sensing circuit in accordance with the present invention. The system includes an oscillator comprising FET 11 having source, drain and gate terminals which can be GaAs or other appropriate material, preferably capable of operation at microwave frequencies. The source of transistor 11 is coupled to reference voltage (ground) via an inductor 13 and the parallel combination of a voltage drop and self biasing resistor 15 and a by-pass capacitor 17. The drain is also coupled to the parallel combination of resistor 15 and capacitor 17 via resistor 29 and voltage drop and self-biasing resistor 19. The gate of the transistor 11 is coupled to reference voltage via a feedback inductor 21. The antenna 5 is coupled to the drain via a matching network 23 in the form of a microstrip circuit and an inductor 25. The output from the oscillator is taken at output terminal 27 which is coupled to the drain. A load resistor 29 is coupled between the drain and a voltage source $V_d$.

In operation, the oscillator circuit of FIG. 2 is predesigned to normally oscillate or not oscillate with a predetermined amount of current being drawn from the power supply $V_d$ to the drain of transistor 11 via load resistor 29. Accordingly, when the effective impedance of the oscillator is changed, such as by the hole or metal index 3 passing within about one wavelength of the antenna 5, the amplitude and/or phase of the feedback signal via inductor 21 will change, thereby causing the oscillator to change from its prior state (oscillating or not oscillating) to the opposite state (non-oscillating or oscillating). This will cause a change in the drain voltage and the voltage at output terminal 27. The signal at output terminal 27 is then sent to a computer or other utilization device.

Referring now to FIG. 3, there is shown a second embodiment of a position sensing circuit in accordance with the present invention. The system includes an oscillator comprising a bipolar/HBT transistor 31 having emitter, collector and base terminals which can be AlGaAs/GaAs or other appropriate material, preferably capable of operation at microwave frequencies. The base of transistor 31 is coupled to reference voltage (ground) via an inductor 33 and the parallel combination of a voltage drop and self biasing resistor 35 and a by-pass capacitor 37. The collector is also coupled to the parallel combination of resistor 35 and capacitor 37 by resistor 47 and voltage drop and self-biasing resistor 39. The emitter of the transistor 31 is coupled to reference voltage via a feedback inductor 41. The antenna 5 is coupled to the collector via a matching network 43 in the form of a microstrip circuit. The output from the oscillator is taken at the output terminal 45 which is coupled to the collector, the collector being coupled to voltage source $V_{cc}$ via load resistor 47 which is coupled between the collector and a voltage source $V_{cc}$.

In operation, the oscillator circuit of FIG. 3 is predesigned to normally oscillate or not oscillate with a predetermined amount of current being drawn from the power supply $V_{cc}$ to the collector of transistor 31. Accordingly, when the effective impedance of the oscillator is changed, such as by the hole or metal index 3 passing within about one wavelength of the antenna 5, the amplitude and/or phase of the feedback signal via inductor 41 will change, thereby causing the oscillator to change from its prior state (oscillating or not oscillating) to the opposite state (non-oscillating or oscillating). This will cause a change in the voltage across the load resistor 47 and at the output terminal 45. The signal at output terminal 45 is then sent to a computer or other utilization device as in the prior embodiment.

Referring now to FIG. 4, there is shown a third embodiment of a position sensing circuit in accordance with the present invention. The system includes an oscillator comprising IMPATT diode 51 having an anode and a cathode. The anode is coupled to a reference source (ground) and the cathode is coupled via load resistor 53 to a voltage source V. The cathode is also coupled to the antenna 5 via a microstrip matching network 55 and an inductor 57. The output is taken at output terminal 59 which is coupled to the cathode, a change in the output condition being sensed at the output terminal when there is a voltage change across load resistor 53 due to a switch of operating mode of the oscillator from oscillating to non-oscillating or vice versa.

In operation, the oscillator circuit of FIG. 4 is predesigned to normally oscillate or not oscillate with a predetermined amount of current being drawn from the cathode of diode 51 to the source of power V via load resistor 53. Accordingly, when the effective impedance of the oscillator circuit is changed, such as by the hole or metal index 3 passing within about one wavelength of the antenna 5, the amplitude and/or phase of the feedback signal via inductor 57 will change, thereby causing the oscillator to change from its prior state (oscillating or not oscillating) to the opposite state (non-oscillating or oscillating). This will cause a change in the amount of current present in the resistor 53, this current change being sensed as a change in voltage at output terminal 59. The signal at output terminal 59 is then sent to a computer or other utilization device.

Referring now to FIG. 5, there is shown a utilization device in the form of a computer 61. The computer 61 receives the signals from the microwave oscillator position sensors, one for each wheel 62, 64, 66 and 68 of an automobile along the lines 63, 65, 67 and 69 respectively. The computer then determines to rotational speed of each wheel individually and sends back a signal to the braking device for each wheel individually along the lines 63, 65, 67 and 69, which can be the same lines as from the microwave oscillator position sensors or separate lines, to control the braking system for each wheel individually, based upon wheel rotational speed.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A sensing system comprising:
   (a) an oscillator circuit normally in one of an oscillating or non-oscillating mode, said oscillator circuit including a feedback circuit including a reactive impedance in the form of a sensing antenna for sensing an external condition, and
   (b) output means coupled to said oscillator circuit and responsive to a predetermined change in the reactive impedance of said antenna which changes the oscillation mode of operation of said oscillator to provide an indication of said change of oscillation mode;
   (c) wherein said oscillator circuit includes a FET having source, drain and gate electrodes, a serial circuit formed of said antenna, a matching circuit and an inductor being connected to said drain, a feedback inductor coupled between a source of reference voltage and said gate, an inductor serially coupled between said source electrode and a parallel connected resistor-capacitor circuit, said resistor-capacitor circuit also being coupled to said source of reference voltage, two resistors in series being coupled between said drain and the junction of said inductor and said resistor-capacitor circuit, said output means coupled to said drain.

2. A sensing system as set forth in claim 1, further including means spaced within up to about 1 wavelength of the normal oscillating frequency of said oscillator circuit from said antenna and movable past said antenna to cause said change in the reactive impedance of said antenna, said oscillator circuit being biased in class B.

3. A sensing system comprising:
   (a) an oscillator circuit normally in one of an oscillating or non-oscillating mode, said oscillator circuit including a feedback circuit including a reactive impedance in the form of a sensing antenna for sensing an external condition, and
   (b) output means coupled to said oscillator circuit and responsive to a predetermined change in the reactive impedance of said antenna which changes the oscillation mode of operation of said oscillator to provide an indication of said change of oscillation mode;
   (c) wherein said oscillator circuit includes a bipolar transistor having emitter, collector and base electrodes, a serial circuit formed of said antenna, a matching circuit and an inductor being connected to said collector, a feedback inductor coupled between a source of reference voltage and said emitter, an inductor serially coupled between said base and a parallel connected resistor-capacitor circuit, said resistor-capacitor circuit also being coupled to said source of reference voltage, two resistors in series being coupled between said collector and the junction of said inductor and said resistor-capacitor circuit, said output means coupled to said collector.

4. A sensing system as set forth in claim 3, further including means spaced within up to about 1 wavelength of the normal oscillating frequency of said oscillator circuit from said antenna and movable past said antenna to cause said change in the reactive impedance of said antenna, said oscillator circuit being biased in class B.

5. A sensing system comprising:
   (a) an oscillator circuit normally in one of an oscillating or non-oscillating mode, said oscillator circuit including a feedback circuit including a reactive impedance in the form of a sensing antenna for sensing an external condition, and
   (b) output means coupled to said oscillator circuit and responsive to a predetermined change in the reactive impedance of said antenna which changes the oscillation mode of operation of said oscillator to provide an indication of said change of oscillation mode;
   (c) wherein said oscillator circuit includes an IMPATT diode having an anode and a cathode, a serial circuit formed of said antenna, a matching circuit and an inductor being connected to said cathode, said anode coupled to a source of reference voltage and said cathode being coupled to a source of power, said output means coupled to said cathode.

6. A sensing system as set forth in claim 5, further including means spaced within up to about 1 wavelength of the normal oscillating frequency of said oscillator circuit from said antenna and movable past said antenna to cause said change in the reactive impedance of said antenna, said oscillator circuit being biased in class B.

7. A control system which comprises:
   (a) a sensing system comprising:
   (b) an oscillator circuit normally in one of an oscillating or non-oscillating mode, said oscillator circuit including a feedback circuit including a reactive impedance in the form of a sensing antenna for sensing an external condition, (c) output means coupled to said oscillator circuit and responsive to a predetermined change in the reactive impedance of said antenna which changes the oscillation mode of operation of said oscillator to provide an indication of said change of oscillation mode, and (d) means responsive to said indication to provide a control function;

(e) wherein said oscillator circuit includes a FET having source, drain and gate electrodes, a serial circuit formed of said antenna, a matching circuit and an indicator being connected to said drain, a feedback inductor coupled between a source of reference voltage and said gate, an inductor serially coupled between said source electrode and a parallel connected resistor-capacitor circuit, said resistor-capacitor circuit also being coupled to said source of reference voltage, two resistors in series being coupled between said drain and the junction of said inductor and said resistor-capacitor circuit, said output means coupled to said drain.

8. A control system as set forth in claim 7, further including means spaced within up to about 1 wavelength of the normal oscillating frequency of said oscillator circuit from said antenna and movable past said antenna to cause said change in the reactive impedance of said antenna, said oscillator circuit being biased in class B.

9. A control system which comprises:
(a) a sensing system comprising:
(b) an oscillator circuit normally in one of an oscillating or non-oscillating mode, said oscillator circuit including a feedback circuit including a reactive impedance in the form of a sensing antenna for sensing an external condition,
(c) output means coupled to said oscillator circuit and responsive to a predetermined change in the reactive impedance of said antenna which changes the oscillation mode of operation of said oscillator to provide an indication of said change of oscillation mode, and
(d) means responsive to said indication to provide a control function;
(e) wherein said oscillator circuit includes a bipolar transistor having emitter, collector and base electrodes, a serial circuit formed of said antenna, a matching circuit and an inductor being connected to said collector, a feedback inductor coupled between a source of reference voltage and said emitter, an inductor serially coupled between said base and a parallel connected resistor-capacitor circuit, said resistor-capacitor circuit also being coupled to said source of reference voltage, two resistors in series being coupled between said collector and the junction of said inductor and said resistor-capacitor circuit, said output means coupled to said collector.

10. A control system as set forth in claim 9, further including means spaced within up to about 1 wavelength of the normal oscillating frequency of said oscillator circuit from said antenna and movable past said antenna to cause said change in the reactive impedance of said antenna, said oscillator circuit being biased in class B.

11. A control system which comprises:
(a) a sensing system comprising:
(b) an oscillator circuit normally in one of an oscillating or non-oscillating mode, said oscillator circuit including a feedback circuit including a reactive impedance in the form of a sensing antenna for sensing an external condition,
(c) output means coupled to said oscillator circuit and responsive to a predetermined change in the reactive impedance of said antenna which changes the oscillation mode of operation of said oscillator to provide an indication of said change of oscillation mode, and
(d) means responsive to said indication to provide a control function;
(e) wherein said oscillator circuit includes an IMPATT diode having an anode and a cathode, a serial circuit formed of said antenna, a matching circuit and an inductor being connected to said cathode, said anode coupled to a source of reference voltage and said cathode being coupled to a source of power, said output means coupled to said cathode.

12. A control system as set forth in claim 11, further including means spaced within up to about 1 wavelength of the normal oscillating frequency of said oscillator circuit from said antenna and movable past said antenna to cause said change in the reactive impedance of said antenna, said oscillator circuit being biased in class B.

* * * * *